United States Patent
Bertin et al.

(10) Patent No.: US 6,177,807 B1
(45) Date of Patent: Jan. 23, 2001

(54) HIGH FREQUENCY VALID DATA STROBE

(75) Inventors: Claude L. Bertin, South Burlington; John A. Fifield, Underhill; Erik L. Hedberg, Essex Junction; Russell J. Houghton, Essex Junction; William R. Tonti, Essex Junction, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/322,465

(22) Filed: May 28, 1999

(51) Int. Cl.[7] ............... G03K 17/16; H03K 19/003
(52) U.S. Cl. ................... 326/30; 326/26; 326/86
(58) Field of Search .................. 326/30, 26, 86, 326/27, 87, 88

(56) References Cited

U.S. PATENT DOCUMENTS

| | | | |
|---|---|---|---|
| 3,660,675 | 5/1972 | Andrews, Jr. | 307/208 |
| 4,124,887 | * 11/1978 | Johnson et al. | 364/107 |
| 4,414,840 | 11/1983 | Zasio | 307/443 |
| 5,334,962 | 8/1994 | Higgins et al. | 333/247 |
| 5,457,406 | 10/1995 | Takada et al. | 326/30 |
| 5,504,689 | * 4/1996 | Fiebrich et al. | 364/481 |
| 5,544,047 | * 8/1996 | Appel | 364/488 |
| 5,990,701 | * 11/1999 | Starr | 326/30 |
| 6,014,037 | * 1/2000 | Gabara et al. | 326/30 |

* cited by examiner

Primary Examiner—Son Mai
(74) Attorney, Agent, or Firm—John J. Goodwin (57) ABSTRACT

A processor with a memory send/received control circuit including a bus drive circuit and a detector circuit connected via control bus line to the control input of the memory. A data input line, or output line, or data input/output line is connected between the processor and the memory. A transmission line stub having a length that is incrementally variable is connected to the memory control input side of the control line 14. The impedance Z0 of the transmission line stub is equal to that of the control line and is open circuited at the end which results in voltage doubling to achieve high speed synchronization between control signals and data signals and to ensure valid data at high clock rates.

6 Claims, 13 Drawing Sheets

NOTE: TYPICALLY, R=Z OF TRANSMISSION LINE

HIGH FREQUENCY VALID DATA STROBE

BACKGROUND OF THE INVENTION

1. Field of the Invention

The present invention relates to high speed data transmission systems, and more particularly to a high speed memory including a stub at a variable end position.

2. Background Art

Very high speed SRAM and DRAM memories have synchronization problems between control signals and data signals. Phase locked loops and digital locked loops are not adequate at such high speed operation.

U.S. Pat. No. 5,457,406 issued Oct. 10, 1995 to Takada et al. entitled "Bidirectional Signal Transmission Circuit and Terminator" discloses a bidirectional signal transmission circuit in which the transmitter circuit of the logic circuit elements used in the conventional single end transmission circuit can be utilized by setting an impedance of an end circuit to be a value greater than a characteristic impedance of a transmission path, by shortening a length of the transmission path for connecting the end circuit with the logic circuit elements, and by increasing am amplitude of an input signal with utilization of a reflection wave produced by an impedance mismatching, such a signal transmission circuit where various types of transmission circuits such as a bidirectional signal transmission circuit and a single end transmission circuit are employed in a mixture form, can be made compact, and low power consumption can be achieved.

U.S. Pat. No. 5,334,962 issued Aug. 2, 1994 to Higgins et al. entitled "High-Speed Data Supply Pathway Systems" discloses a high speed data pathway system used to convey data signals to integrated circuits connected to mother and daughter boards. The integrated circuits include a package and an integrated circuit ship carried by the package. An internal transmission line is carried by the package and coupled to the integrated circuit chip. The package includes both input and output connections for the internal transmission line. A high speed pathway is formed by serially connecting the internal transmission lines with external transmission lines to form a unified transmission medium. Advantageously, the internal transmission lines, external transmission lines and the connection between them have substantially corresponding characteristic impedances.

U.S. Pat. No. 4,414,840 issued Nov. 8, 1983 to Zasio entitled "CMOS Circuit Using transmission Line Interconnections" discloses a CMOS output circuit for an integrated circuit chip used in high speed computers is designed so that it can drive transmission line interconnects to thereby increase the speed of the transfer of signals between chips. The CMOS circuit can drive either a nonterminated transmission line, a terminated transmission line or a random wire. The output circuit enables both low power consumption and high speed to be achieved.

U.S. Pat. No. 3,660,675 issued May 2, 1972 to Andrews, Jr. entitled "Transmission Line Series Termination Network For Interconnecting High Speed Logic Circuits" discloses a series termination network that interconnects high speed logic circuits in a transmission line system for transmitting binary ONE and binary ZERO information. When the logic circuit drives the transmission line to a high voltage state, a first impedance branch of the termination network applies a voltage whose magnitude approximates one half of the magnitude of voltage which defines a binary "ONE". When the logic circuit switches the line to a low voltage state, corresponding to a binary ZERO, the network through a second impedance branch terminates the line in its characteristic impedance.

SUMMARY OF THE INVENTION

An object of the present invention is to provide apparatus for high speed memory operation to achieve high speed synchronization between control signals and data signals.

Another object of the present invention is to provide apparatus for high speed memory operation to ensure valid data at high clock rates.

Still another object of the present invention is to provide a high speed memory including a stub having a short at an end position that is incrementally variable.

A still further object of the present invention is to provide a stub having an opening at an end position that is incrementally variable.

Other and further features, advantages and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

BRIEF DESCRIPTION OF THE DRAWINGS

FIG. 6c shows a detailed CMOS circuit implementation of the circuit of FIG. 6a.

DESCRIPTION OF THE INVENTION

Very high speed operation of memories such as SRAMs and DRAMs results in synchronization problems occurring between control signals and data signals. Phase locked loops or digital locked loops do not perform adequately at such high speed operation.

Transmission lines for memories have well controlled delays per unit lengths, and good high frequency characteristics. A delay line may be used to accurately set the time delay between control pulses and data pulses such that a data strobe occurs in synchronism with data arrival at the processor of the memory. For example, the strobe transition can be set to occur at the midpoint of the data valid window.

Figure 1:
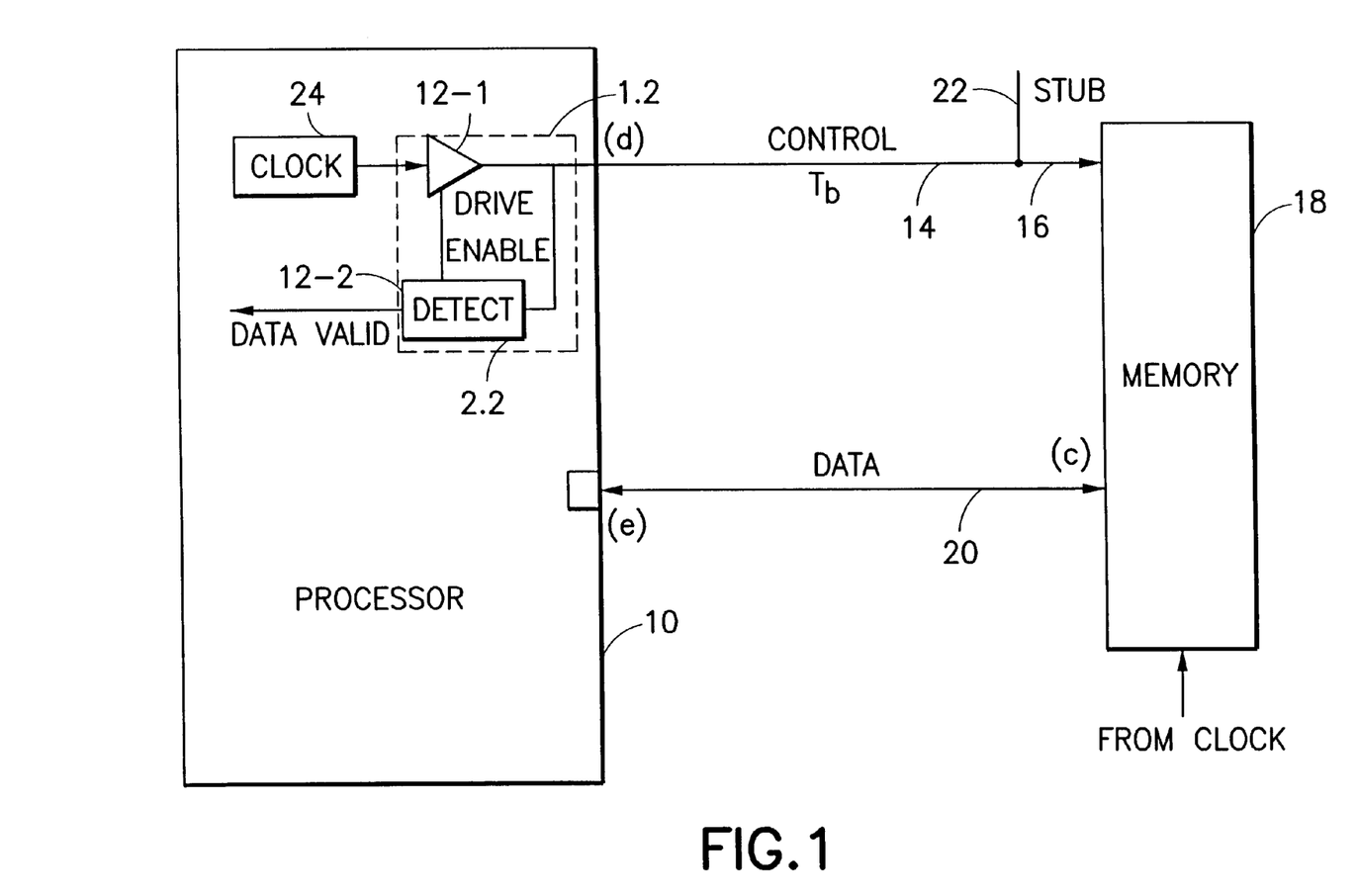
FIG. 1 is a schematic block diagram of an embodiment processor and memory configuration according to the principles of the present invention.

FIG. 1 shows a processor 10 with a memory send/received control circuit 12 including a bus drive circuit 12-1 connected to a processor clock 24 and a detector circuit 12-2 connected via control bus line 14 to the control input 16 of the memory 18. Detector circuit 12-2 is enabled by a signal from bus drive circuit 12-1. A data input line, or output line, or data input/output line 20 is connected between the processor 10 and the memory 18. A transmission line stub 22 is connected to the memory control input side of the control line 14. The impedance Z0 of transmission line stub 22 in the present embodiment is equal to that of the control line 14 and is open circuited at the end which results in voltage doubling. Send/receive circuit 12 has a terminating impedance of Zo. The time delay between the processor 10 and the memory 18 is Tb, and the memory delay line stub 22 has a delay of Ts.

During a read operation, the bus driver 12-1 in the send/receive circuit 12 transmits a clock pulse on bus line 14 and then tristates to a high impedance state. Detector 12-2 (i.e. receiver) is activated and receives the clock pulse at time 2 Tb+2 Ts, which coincides with the arrival of the first data pulse. Subsequent data pulses are now synchronized with the clock pulse until the word or page is read. A write operation does not require synchronization.

Figure 2:
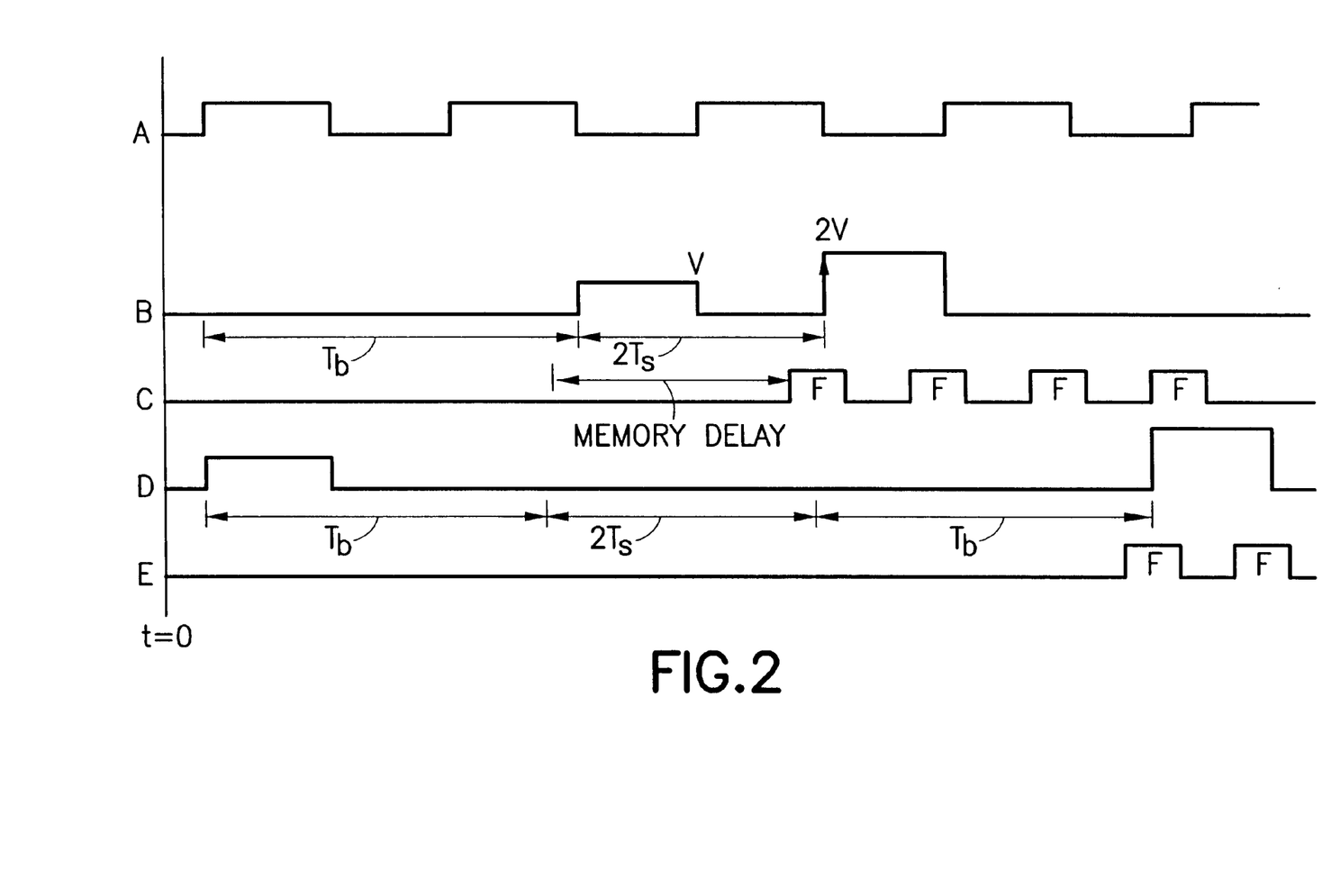
FIG. 2 is an illustration of the waveforms for clock pulses, control pulses and data pulses occurring in the operation of the processor and memory of the embodiment of FIG. 1.

FIG. 2 shows the processor clock pulses A. Also shown are the memory control pulses B and data pulse Cs at the memory 18, and the processor control pulse D and data pulses E at the processor 10. The delay Ts of stub 22 is adjusted such that the strobe transitions indicated by arrows (up and down) at the processor D occur at the mid point of the valid data pulses F at the processor data pulses E. Data transitions correspond to each clock transitions (positive and negative) for double data rate (DDR) operation. The processor and memory may be separate chips, or the processor and memory may be on the same chip as part of a system on chip (SOC) implementation.

The processor clock signal on line 24 has a 1 ns periodicity (1 Ghz/s frequency). The control signal arrives at the memory 18 at time Tb, which is 1.375 ns for this example. The module delay from clock transition to the midpoint of data out is 1.125 ns for the present embodiment. The strobe is set to transition at the midpoint of the data window. The strobe transition is generated by the round trip time of the open ended transmission line stub 22. The stub round trip time 2 Ts=1.125 ns; Ts=562.5 ps. For a memory connection 18 with a delay of 1 ns for 10 inches, the stub length=5.625 inches. The control bus 14 delay is Tb=1.375 ns. The time from the start of the control signal start to the first strobe at the data window midpoint=2 Tb+2 Ts=3.875 ns.

The on chip transmission line timing stub will require two conductive layers, one of which may be a power plane with openings to allow connections with the circuits below and the pads above. A low resistivity is desirable, so copper would be a good choice of metal, although others such as aluminum may be used. The delay per unit length of line td=$(LC)^{1/2}$=$(ErEoUo)^{1/2}$, where L is the inductance per unit length, C the capacitance per unit length, Er is the relative dielectric constant of the insulator between the metal layers, Eo is the permittivity of free space, and Uo is the permeability of free space. As can be seen the delay per unit length is independent of temperature, voltage, dimensional tolerances, etc. A typical range of dimensions would be metal thickness of 1–2 microns, dielectric thickness of 1–2 um, transmission line conductor width in the 1 to 5 um range. If the dielectric is silicon dioxide, Er=4 and the delay per unit length of the delay line timing stub is 67 ps/cm. If the dielectric is tantalum pentoxide, Er=20 and the delay per unit length of the delay line timing stub is 150 ps/cm. Other dielectric materials such as silicon nitride, Er=7.5, etc. may also be used. For a transmission line stub of length=2 cm, the round trip delay is 600 ps and for length=4 cm, the round trip delay is 1.2 ns.

Figure 3:
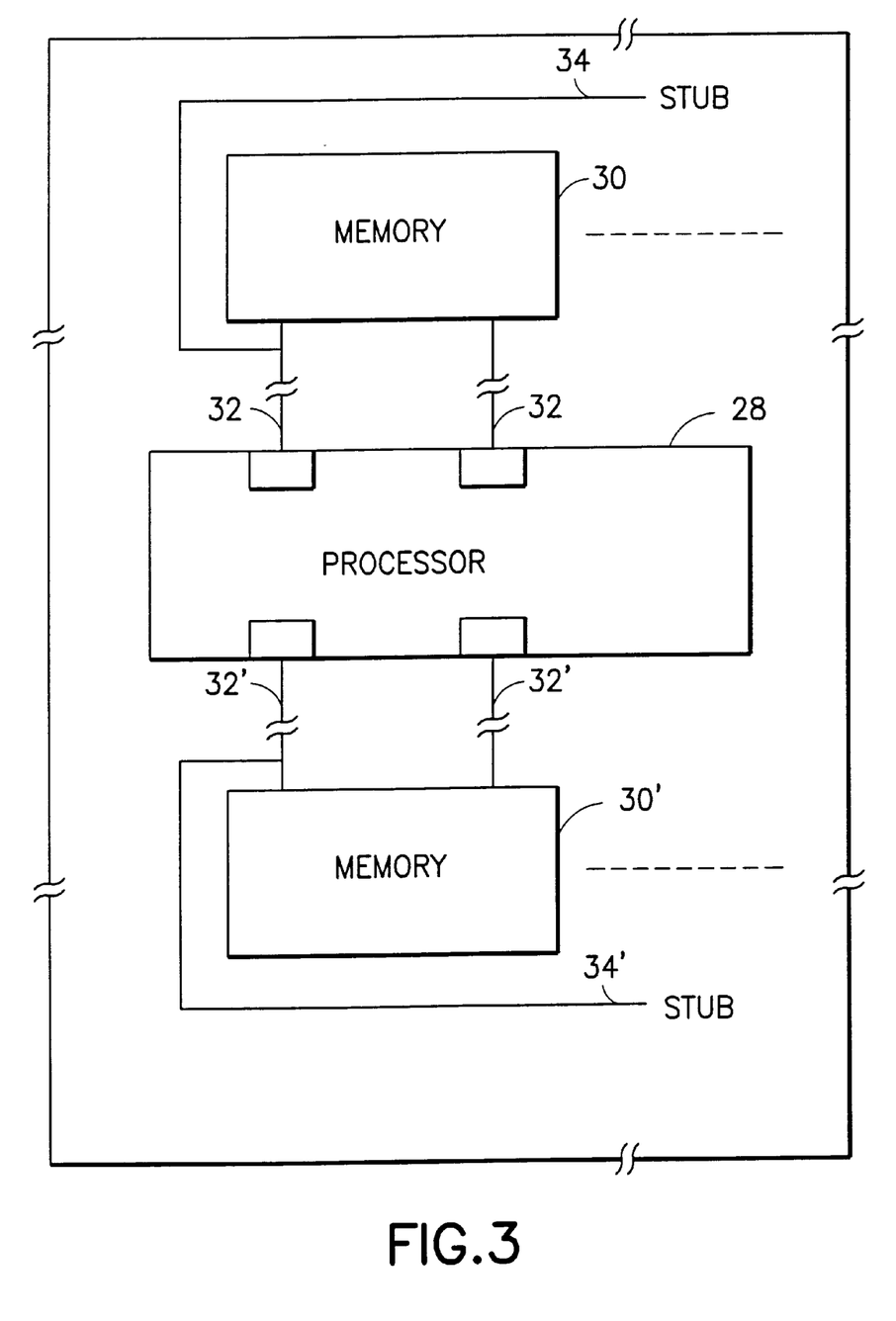
FIG. 3 is an illustration of a memory card including a processor and memory modules, bus lines, and a transmission line stub.

FIG. 3 shows an example of a processor with point-to-point connections to at least two memory functions. The processor and memories may be on separate chips or on the same chip. For system on chip (SOC) applications, the processor and memory operating frequencies can be very high, with clock frequencies in the several gigahertz range. In order to achieve very high performance, it is necessary that the information from the memories 30 arrive at processor 28 at the same time. The memories may, however, be at different physical distances (connections 32 and 32') from the processor 28, there may be differences in the memory performances, etc., all of which can introduce timing skews which can limit performance. Stub 34 for memory 30 and stub 34' for memory 30' can be adjusted to compensate for the various combination of timing skews such that the data from memories 30 and 30' arrive at processor 28 at the same time.

Figure 4A:
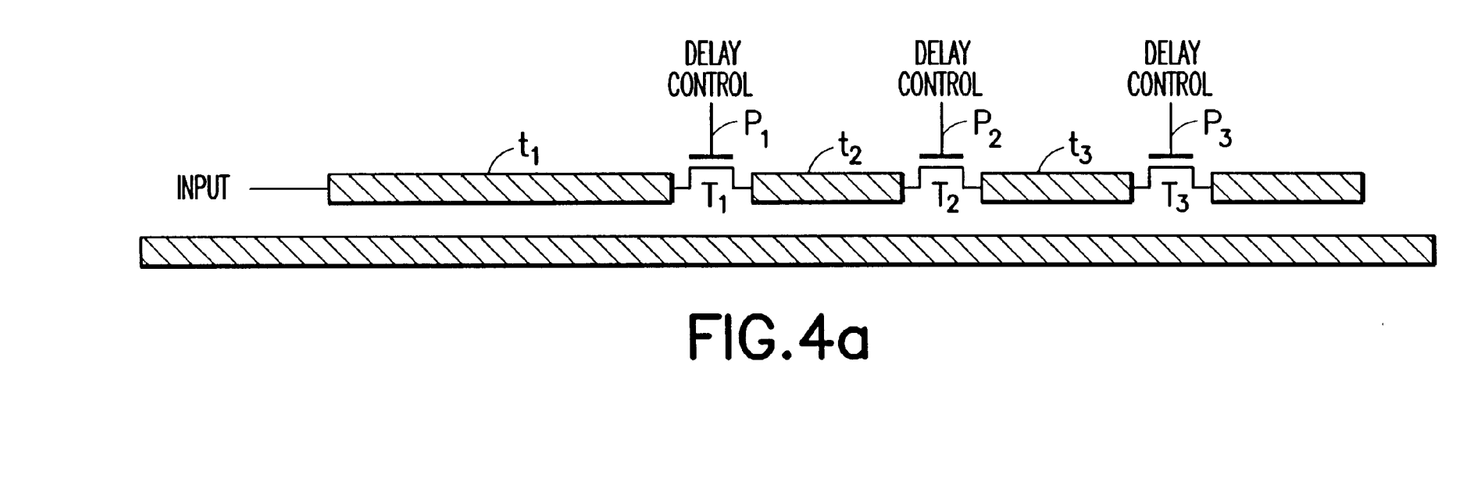
FIGS. 4a and 4b show cross sections of a transmission line with several series transistors to form an open stub adjustable delay element.
Figure 5A:
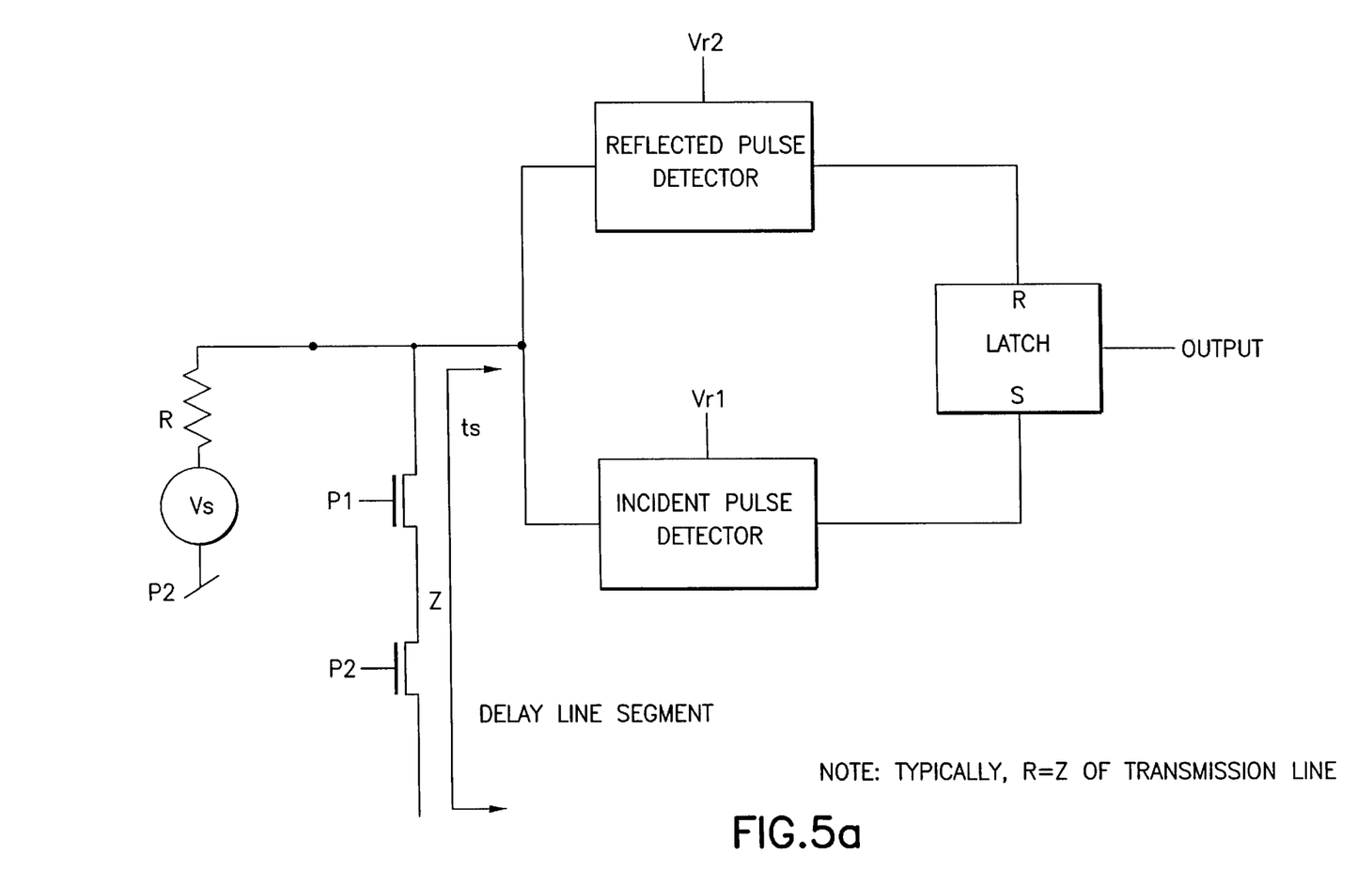
FIGS. 5a, 5b and 5c show the incorporation of the variable transmission line of FIG. 4a into a timing circuit.
Figure 5B:
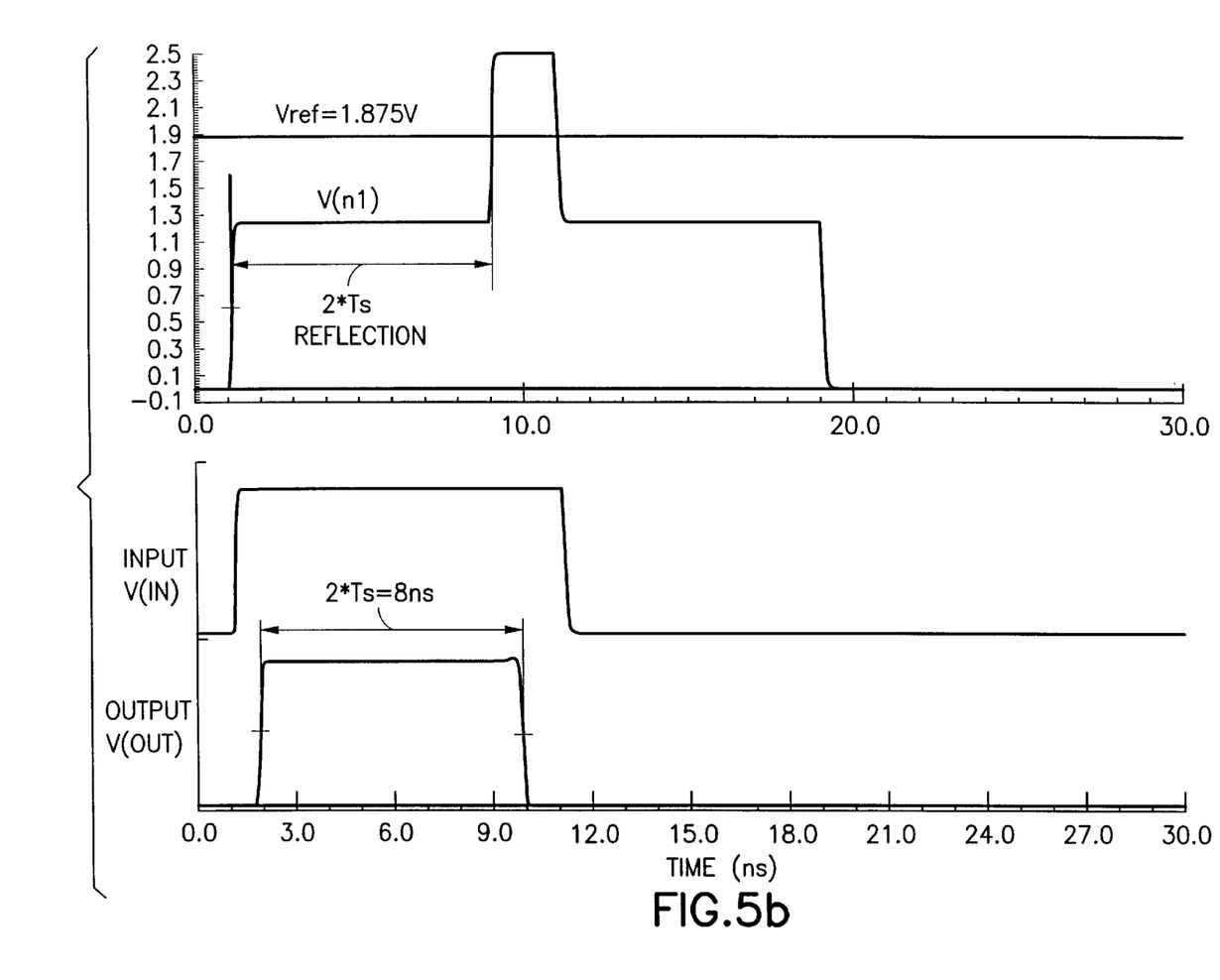

There are a number of ways to control timing using the round trip time on transmission line stubs. First, the line may be etched to a desired length photolythographically, with the timing preset by initial design/processing. Another means is to cut a transmission line to a desired length using a laser at wafer level. It is also possible to adjust the transmission line stub delay electronically at the wafer or packaged level. FIG. 4a shows a transmission line with several series transistors to form an open stub adjustable delay element. The transistors are normally in the "on" state with a resistance typically less than 5 ohms. P1, P2, P3 are inputs to the gates of the various transistors with positive voltage when in the "on" state. Delay increments t1, t2, and t3 are shown between the transistors. For a round trip delay of 2(t1+t2), gate P1 is at a high voltage with transistor T1 in the "on" state with resistance <5 ohms. Transistor T2 is "off", with P2 at a low voltage. In the "off" state, the transistor resistance is greater than 10 K-ohms, for example, much larger than the Z of the transmission line which will typically be less than 75 ohms and therefore the transmission line stub will be open beyond transistor T2. Transistor T3 may be "on" or "off" since the incident pulse from the input will be reflected at the T2 node and never reach transistor T3. The reflected waveform will arrive at the input 2(t1+t2) later, independent of temperature, voltage, and dimensional control. FIGS. 5a, b, and c will be used to explain the incorporation of FIG. 4a variable transmission line into a timing circuit. Transmission line stub delay timing control becomes more valuable for large chips (30 mm on a side and larger) on large 300 mm for example with more system integration per chip.

Figure 4B:
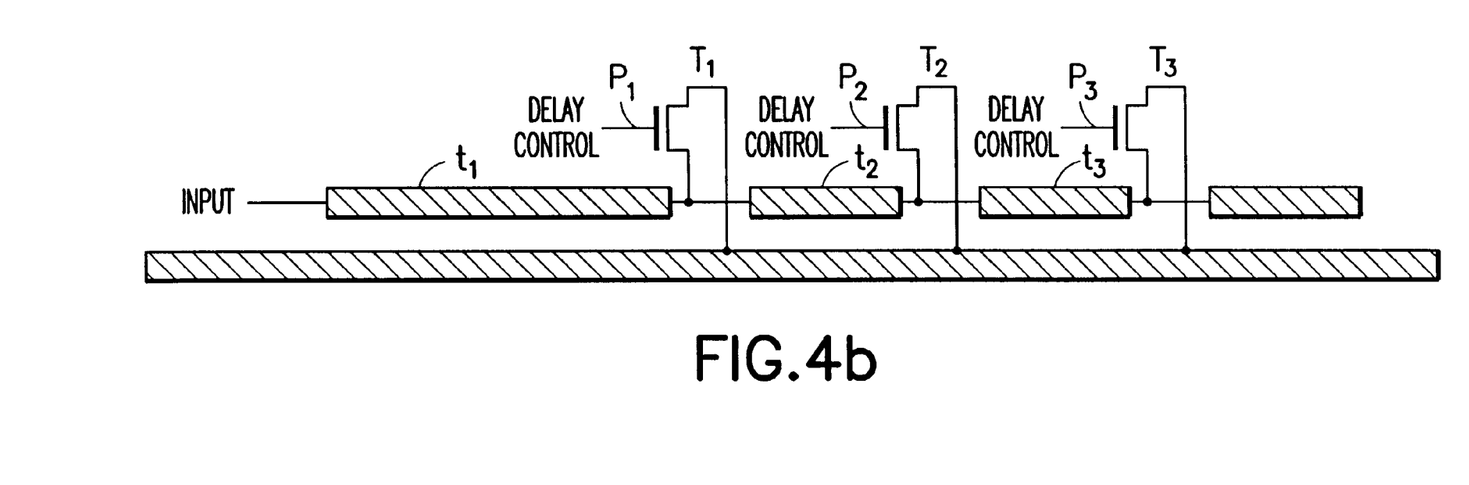
Figure 6A:
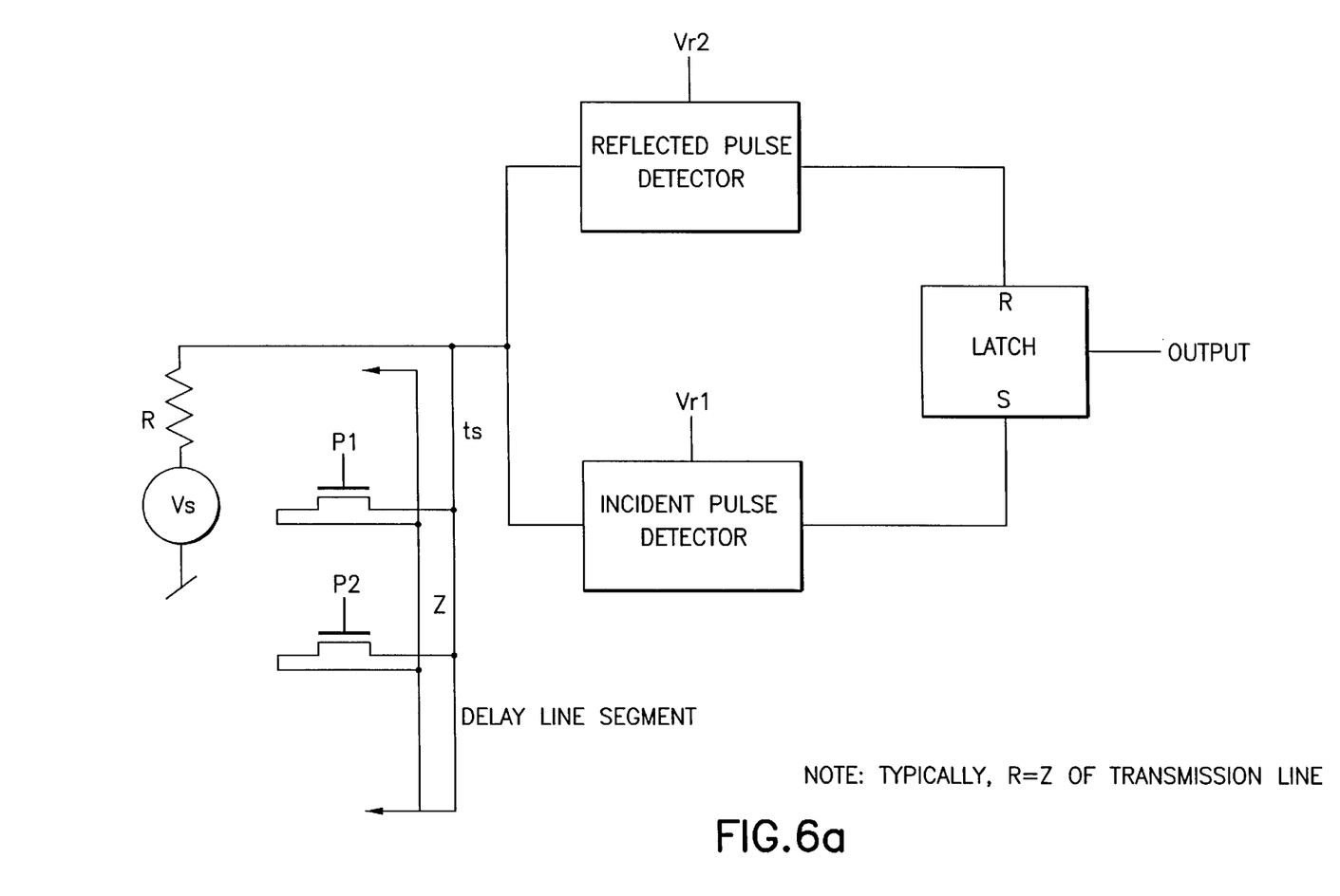
FIG. 6a shows a block diagram of a deletion circuit which incorporates an example of the precision timing the electronically controlled variable delay line of FIG. 4b.
Figure 6B:
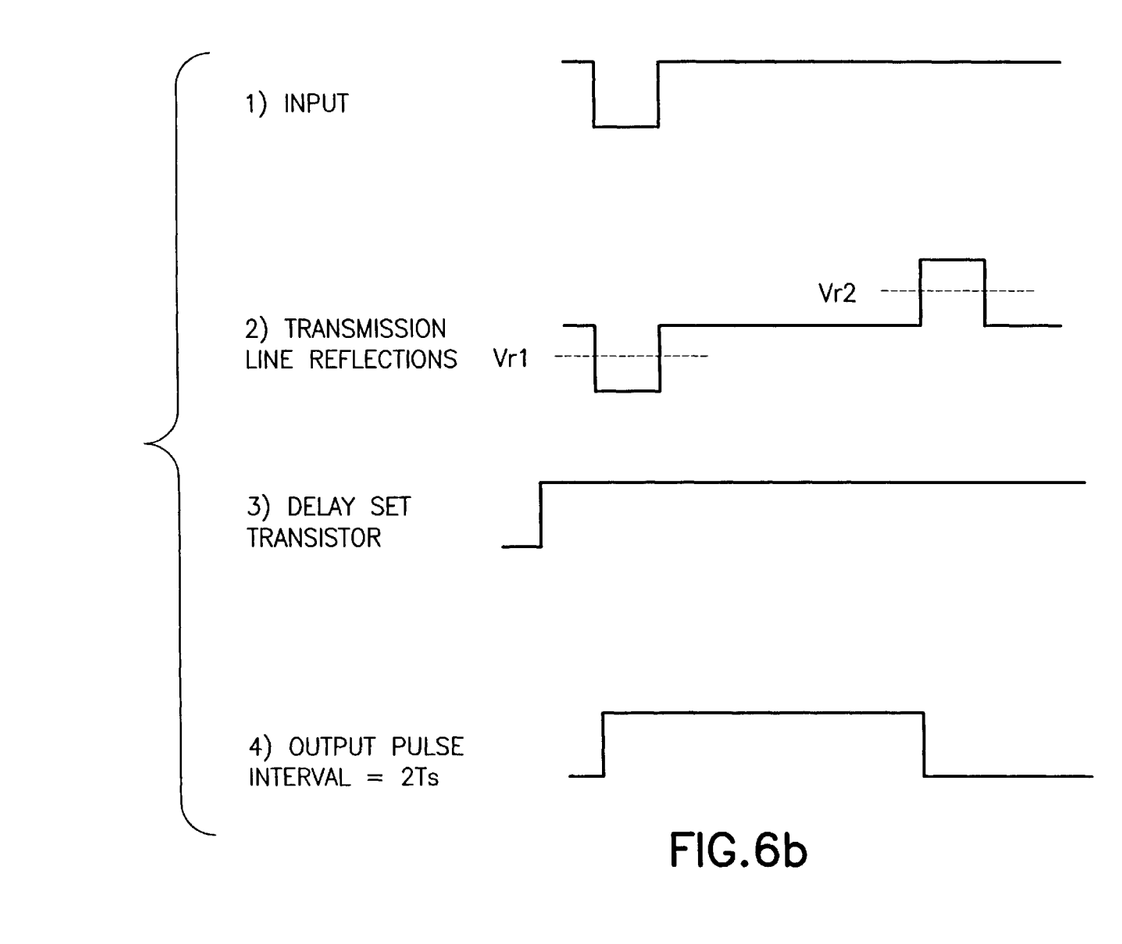
FIG. 6b illustrates voltage pulses associated with the circuit of FIGS. 5a, 5b and 5c.

FIG. 4b shows a transmission line with several parallel transistors to form a shorted stub transmission line. The transistors in the "off" state with a resistance typically greater than 10 K-ohms. P1, P2, P3 are inputs to the gates of the parallel transistors are normally at zero volts. Delay increments t1, t2 and t3 are shown between the transistors. For a round trip delay of 2(t1+t2+t3), transistors T1 and T2 are "off" and not loading the transmission line. Transistor T3 is "on" with P3 at high voltage, with a resistance value of less than 5 ohms. This causes a reflection to propagate back to the input. It will arrive delayed by 2(t1+t2+t3) independent of voltage, temperature, dimensional tolerances, and it will be of opposite polarity to the incident waveform. FIGS. 6a, b, c, and d will be used to explain the incorporation of FIG. 4b variable delay transmission line into a timing circuit.

Figure 5C:
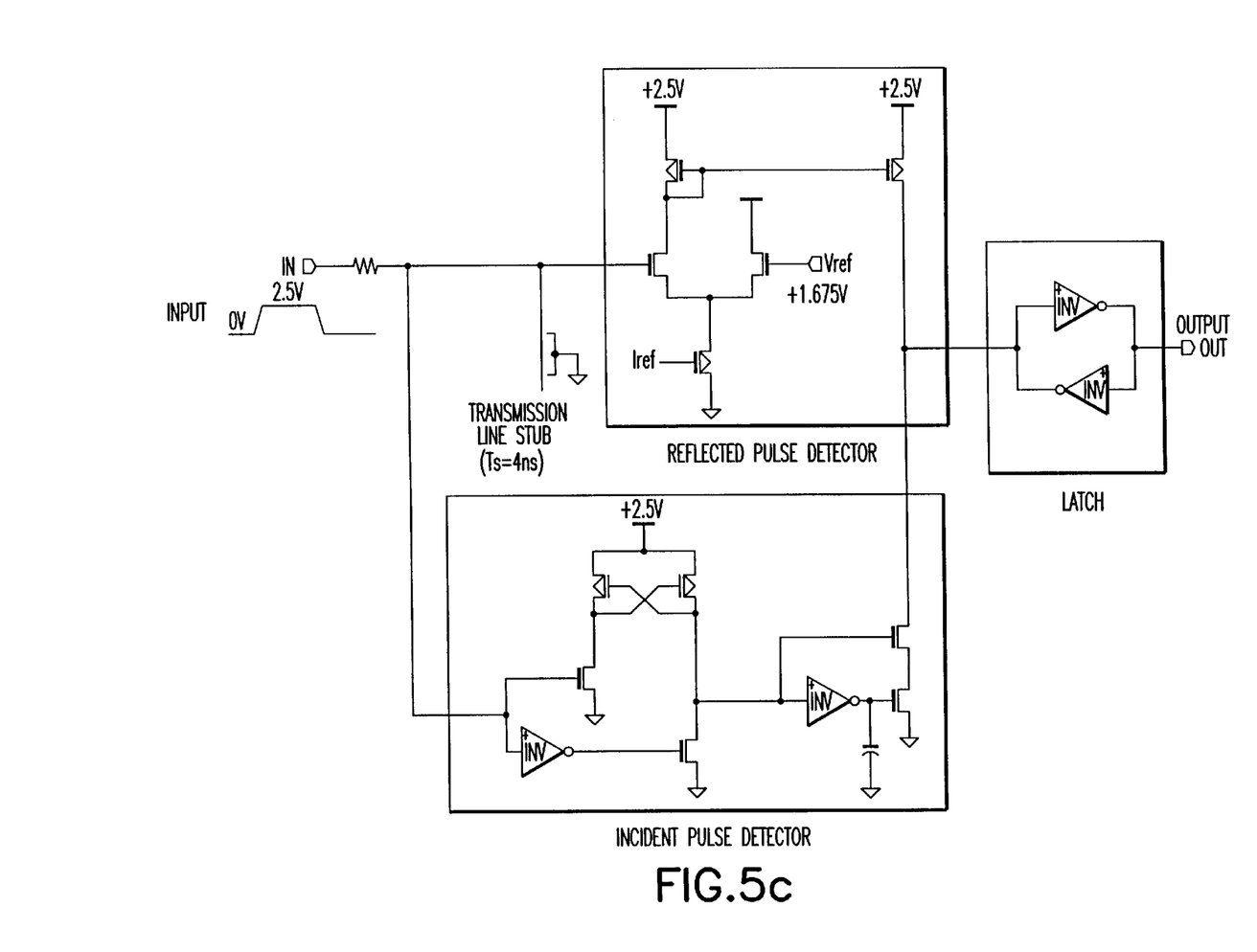

FIG. 5a shows a block diagram of a section circuit which incorporates electronically controlled variable delay line from FIG. 4a. The latch is in the reset position with output voltage low (ground). A voltage source Vs applies a pulse through resistance R. R is typically chosen equal to the transmission line impedance Z so that the open circuit reflection will be terminated at the sending end. As can be seen from FIG. 5b, the incidence pulse detector responds to the input waveform and sets the latch causing the output voltage to transition to the high voltage state. The input waveform is set to be wider than the round trip delay time 2(ts) so that a step is generated at the input after the round trip delay. The pulse width is adjusted so that the high voltage is of sufficient duration to activate the reflected pulse detector, which resets the latch, causing the output voltage of the latch to return to low (ground) value. The latch pulse output has a duration of 2(ts), very accurately set by the transmission line delay. The delay ts may be varied by the selection of transistors T1, T2, T3, etc. as discussed with respect to FIG. 4a. FIG. 5c shows a detailed CMOS circuit implementation of FIG. 5a. The reference voltages may be set by using temperature, voltage independent circuits using band gap regulators well known in the art.

Figure 6C:
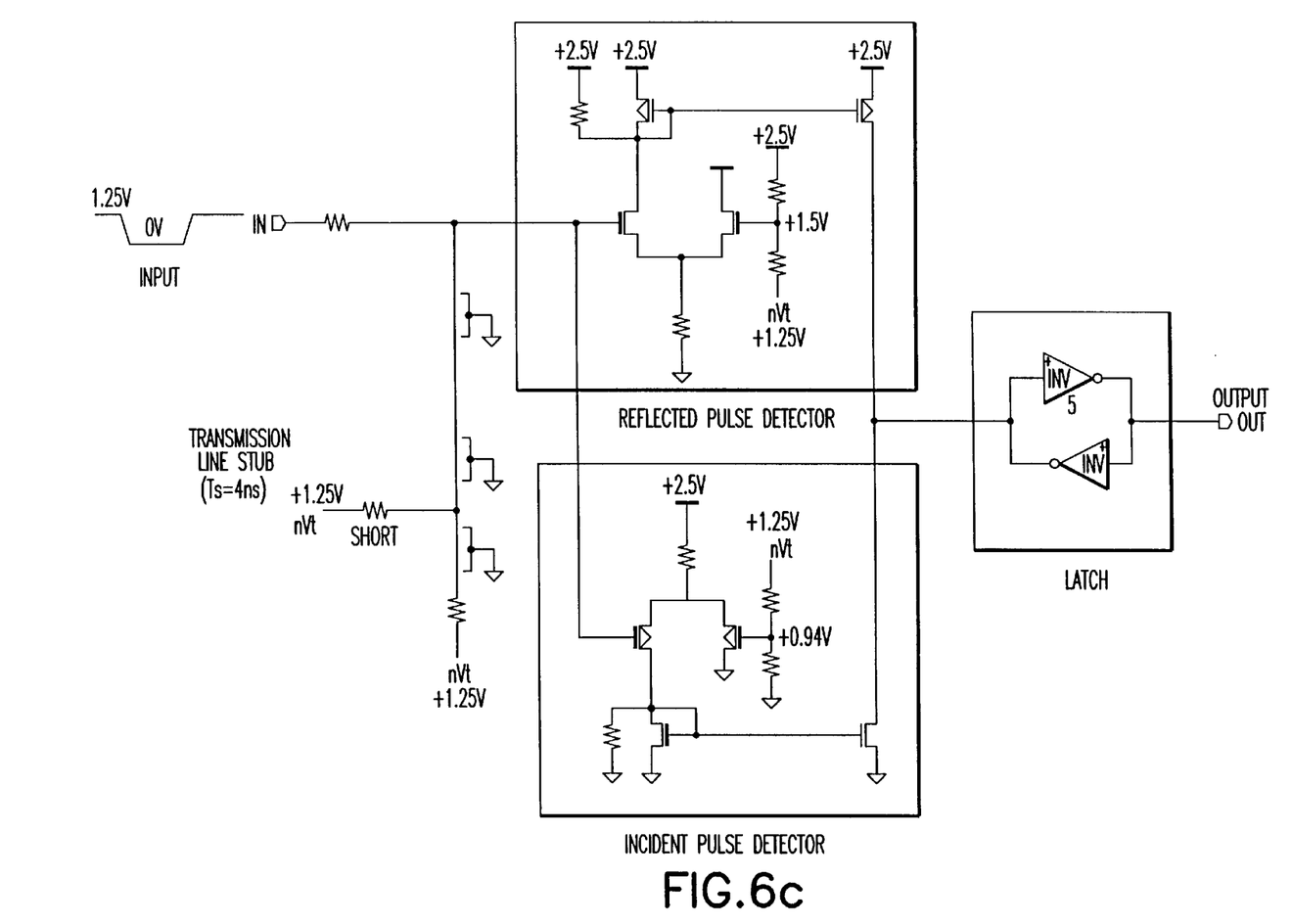

FIG. 6a shows a block diagram of a detection circuit which incorporates electronically controlled variable delay line from FIG. 4b. The latch is in the reset position with output voltage low (ground). A voltage source Vs applies a pulse through resistance R. R is typically chosen equal to the transmission line impedance Z so that the short circuit reflection will be terminated at the send end. The transmission line is shorted at the end. If all transistors are in the "off" state, then the full round trip transmission line delay will be used. As can be seen from FIG. 6b, the input is a negative going pulse. Because a low resistance of less than 5 ohms reflects a pulse of opposite polarity to the sending pulse, the reflection is positive. The input pulse is selected to be of shorter duration than the round trip time delay 2(ts) on the transmission line stub. As a result, there are two distinct pulses, the negative input pulse and the positive reflection. The output latch is reset, output voltage is low (ground) prior to the input pulse transition. The Incident Pulse Detector in FIG. 6a is triggered by the negative transition of the input pulse and sets the latch to a high voltage output. After time 2(ts) the positive reflection triggers the Reflected Pulse Detector and the latch is reset with the output voltage returning to a low voltage (or ground). The latch output has a pulse of duration 2(ts), very accurately set by the transmission line delay. The delay ts may be varied by the selection of transistors T1, T2, T3, etc. as discussed with respect to FIG. 4b. FIG. 6c shows a detailed CMOS circuit implementation of FIG. 6a. The reference voltages may be set by using temperature, voltage independent circuits using band gap regulators well known in the art.

Figure 6D:
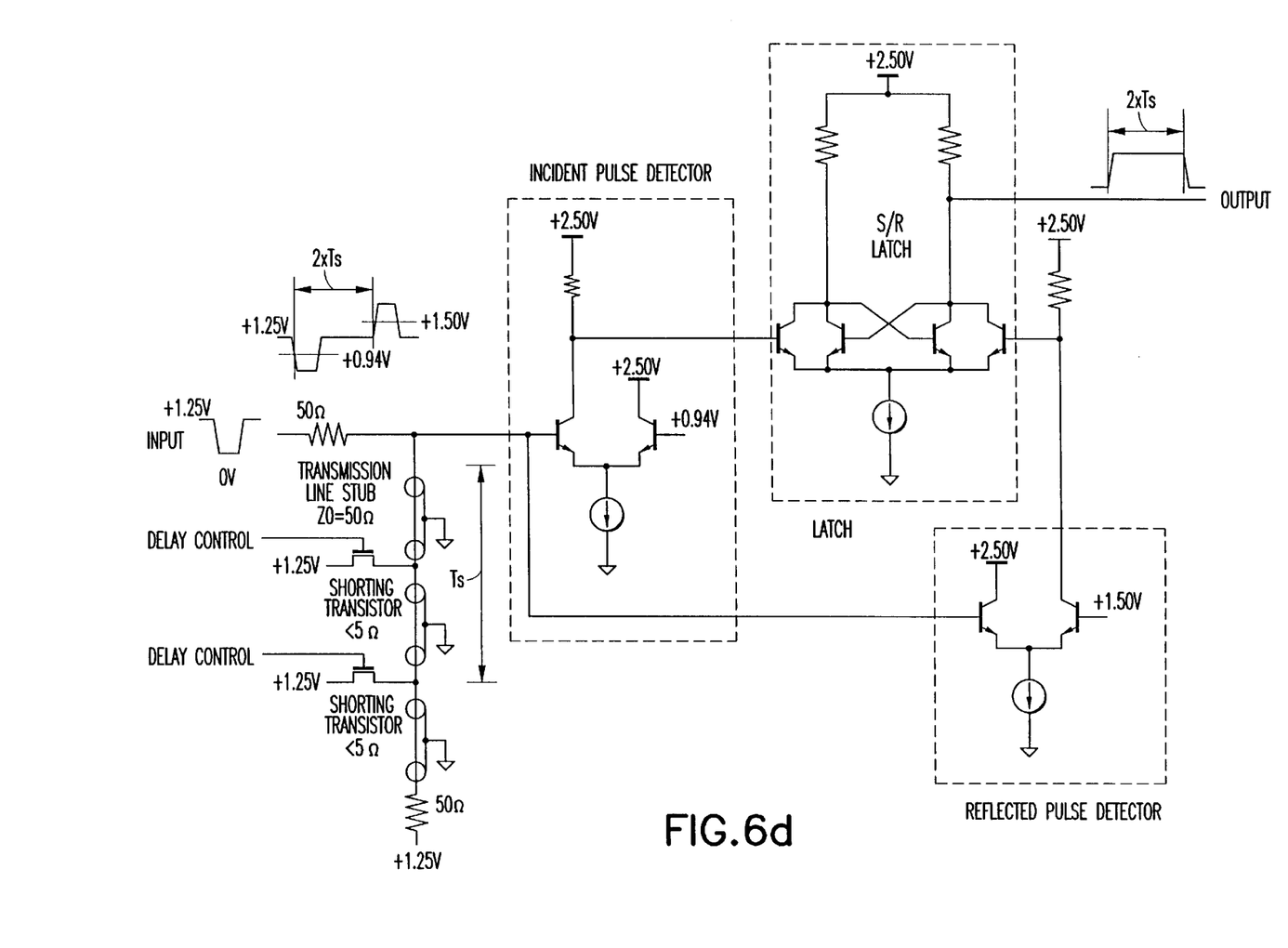
FIG. 6d shows a BiCMOS example of a detection and latch circuit.

The transmission line delays are precise so the variations in delay are introduced by the detector circuits and the latch. In order to minimize the delay, it is desirable to have the circuit delay as short as possible relative to the transmission line delay time and to minimize circuit sensitivity to temperature and voltage variations. FIG. 6d shows a BICMOS example of a detection and latch circuit. The BiCMOS circuit is faster than the CMOS circuits because of the high speed of bipolar transistors, and therefore is a smaller fraction of the total delay time, which includes the stub delay and circuit delay. In addition, tracking between adjacent bipolar Vbe parameters is at least one order of magnitude better than tracking between adjacent FET transistors for better detector resolution. Finally, bipolar transistors circuits are less sensitive to temperature and voltage variations than are CMOS transistors. Therefore, for exceptionally tight pulse timing control, it is advantageous to use FIG. 6d.

Figure 7:
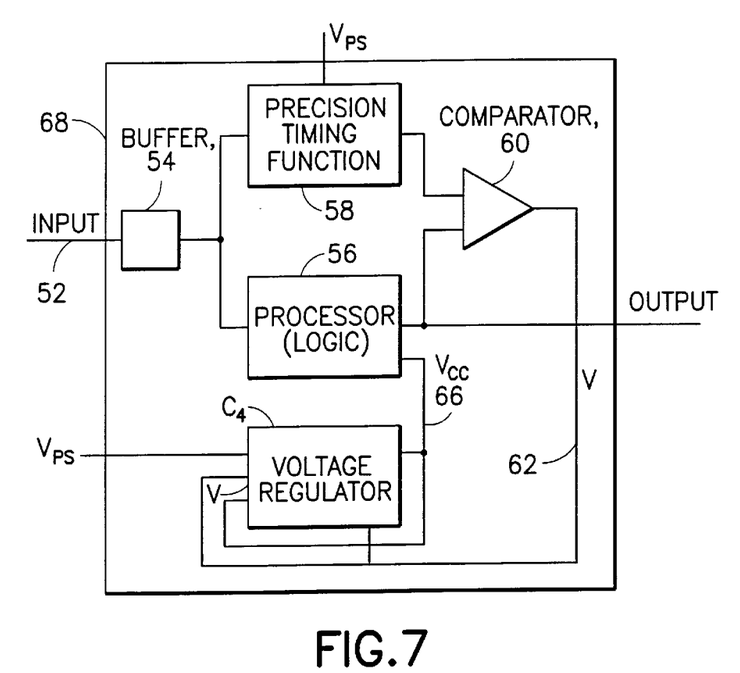
FIG. 7 shows a subsystem with the precision timing control function included as part of the subsystem function.

FIG. 7 shows a subsystem 68 with the precision timing control function of FIGS. 5a or 6a included as part of the subsystem function. The input timing on lead 52 is buffered at buffer circuit 54 and drives a processor (logic) function 56 and the precision timing function 58. A comparitor 60 measures the difference in delay (performance) and sends control signal V on line 52 to a voltage regulator 64. The voltage regulator 64 controls a process voltage Vcc on line 666 and adjusts performance (perf=f(voltage)) and holds to tight performance tolerances determined by the precision timing function 58.

The voltage regulator is shown modulating the processor performance by controlling the applied voltage Vcc. If the voltage is higher, the circuit will go faster, and if the voltage is lower, the circuit will be slower. It is also possible to control the performance by modulating the threshold voltage of FET devices. As is well known in the art, the threshold voltage of a device varies with the source to substrate (or well) potential. Instead of varying the applied circuit voltage Vcc, it is possible to modulate the well voltage relative to the source. If the threshold voltage is increased, the circuit is lower, if threshold is lower, the circuit will be faster.

Figure 8:
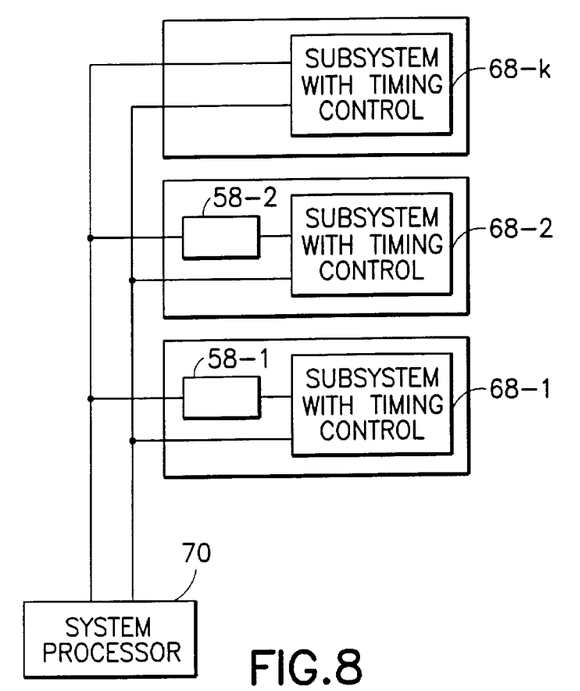
FIG. 8 shows a precision timing function included with each subsystem except for the last, most distant.

FIG. 8 shows an example of a system connected to the system processor 70 with a precision timing function 58 included with each subsystem 68-1, 68-2, except for the last (the most distant) subsystem 68-k.

This means that the response of subsystems 68-1, 68-2, and 68-k will arrive at different times to the system processor 70. The system processor 70 may be on the same chip as subsystems 68 or they may be on separate chips. Precision timing functions 58 may be used to compensate for timing differences.

Figure 9:
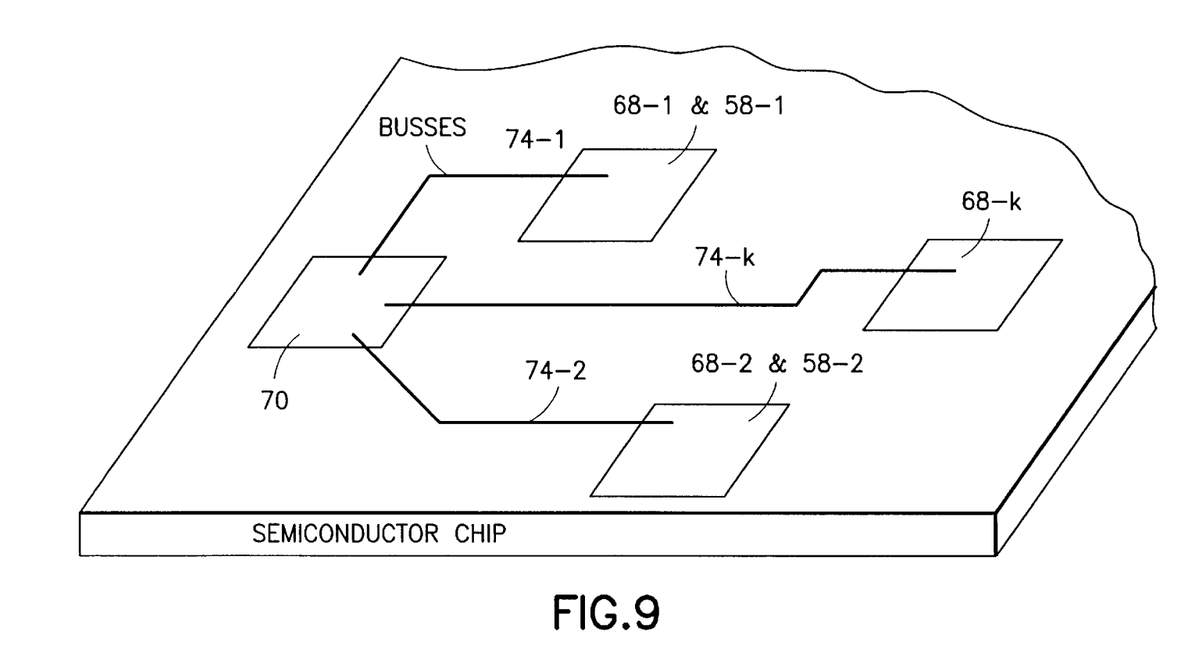
FIG. 9 is a schematic illustration of the FIG. 8 function integrated on one chip.

FIG. 9 is a view of the FIG. 8 function all integrated on one chip (SOC). As can be seen, the subsystems are placed at widely varying distances from the system processor 70. Subsystem outputs will arrive on the busses 72-1, 72-2, . . . 72-k at the system processor at different times due to different bus delays.

Figure 10:
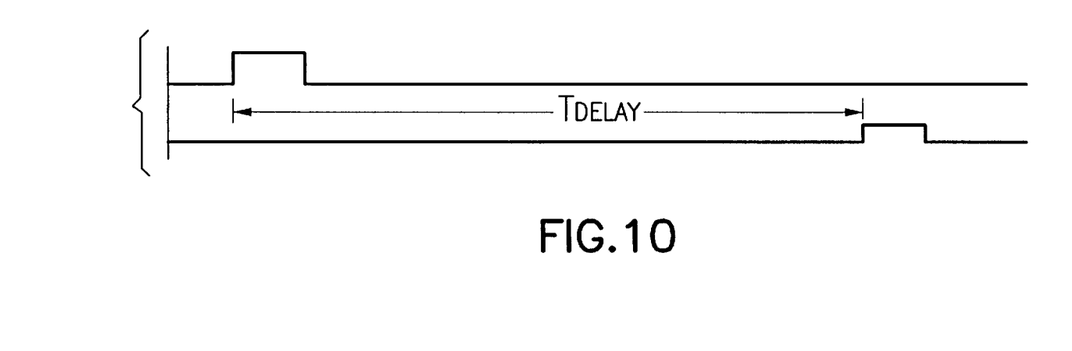
FIG. 10 shows the timing and delay settings for each of the precision timing delay circuits as a function of position.

FIG. 10 shows the timing and delay settings of the system of FIG. 9 for each of the precision timing delay circuits as a function of positions 1, 2 through k.

For bus 72-1, TDelay=2TB1+2(TBk−Tb1)+Tsubsystem delay.

For bus 72-1, TDelay=2TB2+2(TBk−Tb2)+Tsubsystem delay.

The precision delay elements 74-1, 74-2, . . . 74-k shown in the example have delays selected to ensure that all signals arrive back to the system processor 70 at the same time. Each subsystem with timing controls shown in FIG. 8) gives the same delay independent of position on the bus. Element 74-k associated with the subsystem 68-k, the furthest, has an additional delay of the bus round trip time 2 Tb2. Thus the longest delay experienced is 2 Tbk+T subsystem delay, as shown in FIG. 10. The round trip delay to position 2 is 2 Tb2. The precision timing function 58-2 is set for a delay of 2 Tbk−2 Tb2, such that the total delay is the same as for position k. FIG. 8 shows the delay setting of precision timing function 58-1 to achieve the same delay as position k. By inserting precision timing functions as shown in FIG. 8, all signals arrive simultaneously at the system processor as shown in FIG. 10.

What has been described is a system on chip (SOC) with processor and memory, or a system with multiple chips mounted on a card or board, having a stub having a short or an open at an end position, the end position being incrementally variable such that the stub length may be set physically or electronically to ensure that when the data signal goes back for data verification it is in the middle of the data window of the processor.

While the present invention has been particularly described with respect to certain elements in its preferred embodiment, it will be understood that the invention is not limited to these particular apparatus described in the preferred embodiments, or the final structures depicted in the drawings. On the contrary, it is intended to cover all alternatives, modifications, and equivalents as may be included within the spirit and scope of the invention defined by the appended claims.

What is claimed is:

1. A semiconductor circuit comprising:
   a plurality of transmission line elements;
   an input line for receiving an input pulse;
   a transmission line stub element for selecting a predetermined transmission time delay increment by reflecting the input pulse through the transmission line elements to create a reflection pulse; and
   an output pulse generator having a sensing circuit for sensing the input pulse and the reflected pulse and generating an output pulse having a pulse width that is a fixed interval.

2. The semiconductor circuit of claim 1 wherein the transmission line stub is incrementally variable to provide a variable time delay.

3. A semiconductor circuit comprising:
   at least one data storage memory having a control input terminal and a data input terminal;
   a data processor including a send/receive control bus circuit connected via a control bus line to the memory control input terminal of the at least one memory for sending and receiving control signals to and from the at least one memory, and a data line connected to the at least one memory data input terminal for transmitting data signals to and from the at least one memory;
   a transmission line stub connected to the at least one control bus line at the memory control input terminal for providing a time delay to synchronize the control signals with the data signal;
   wherein the send/receive control bus circuit includes a drive circuit responsive to a clock signal input to produce control signal pulses, and a detector circuit connected to the driver circuit and to the control bus line, the detector circuit being enabled by the driver circuit to receive pulses from the memory on the control bus line that are time delayed by the transmission line stub and are synchronized with the data signals on the data line.

4. The semiconductor circuit of claim 3 wherein the impedance of the transmission line stub is Z0 and the send/receive control bus circuit has an impedance of Z0.

5. The semiconductor memory of claim 3 wherein the transmission line stub is incrementally variable to provide a variable time delay and wherein the time delay between data processor and the memory is Tb, the transmission delay line stub has a time delay of Ts, and wherein the pulses received on by the detector circuit on the control bus line from the memory are at time 2 tb+2 Ts and are in synchronism with the data signal pules from the memory on the data line.

6. The semiconductor circuit of claim 3 wherein the semiconductor circuit comprises a plurality of k data storage memories, each connected to the data processor by a control bus line and a data line.

* * * * *